United States Patent [19]
Suzuki et al.

[11] Patent Number: 5,212,107
[45] Date of Patent: May 18, 1993

[54] WIRING METHOD FOR SEMICONDUCTOR INTEGRATED CIRCUITS

[75] Inventors: Katsuyoshi Suzuki, Hadano; Tatsuki Ishii, Tokyo; Tomio Taniguchi, Yokohama, all of Japan

[73] Assignees: Hitachi, Ltd., Tokyo; Hitachi Software Engineering Co., Ltd., Yokohama, both of Japan

[21] Appl. No.: 830,338

[22] Filed: Jan. 31, 1992

[30] Foreign Application Priority Data

Jan. 31, 1991 [JP] Japan .................................. 3-10293

[51] Int. Cl.⁵ .......................................... H01L 21/70
[52] U.S. Cl. ...................................... 437/51; 437/195; 257/499
[58] Field of Search ............... 437/51, 195, 8; 357/41; 364/490

[56] References Cited
U.S. PATENT DOCUMENTS 4,516,312  5/1985  Tomita .................................. 437/51

FOREIGN PATENT DOCUMENTS 2940593   4/1981  Fed. Rep. of Germany ........ 437/51
0240652  10/1986  Japan ................................... 437/51
0172447   7/1988  Japan ................................... 437/51
  42146   2/1989  Japan .

Primary Examiner—Tom Thomas
Attorney, Agent, or Firm—Antonelli, Terry, Stout & Kraus

[57]  ABSTRACT

A novel wiring method for multilayered semiconductor integrated circuits is disclosed. For example, a semiconductor integrated circuit of a 6-layered wiring structure can be formed with a first layer covered with gates, a second layer, a third layer, a fourth layer and a fifth layer making up logic wiring layers, and a sixth layer making up a power layer. Lattice-shaped wires are formed in a longitudinal direction on the second layer and the fourth layer, and in a lateral direction on the third layer and the fifth layer. The second layer forming the bottom layer and the fifth layer forming the uppermost layer, or a combination of the second layer and the fifth layer of a general wiring structure are used as main layers of wires requiring consideration of signal transmission delay time.

8 Claims, 5 Drawing Sheets

WIRING METHOD FOR SEMICONDUCTOR INTEGRATED CIRCUITS

BACKGROUND OF THE INVENTION

The present invention relates to a method of wiring semiconductor integrated circuits, and more particularly to a wiring technique for semiconductor integrated circuits of multilayered structures considering the signal transmission delay time effectively applicable to a wiring method for semiconductor integrated circuits which possibly reduces variations in signal transmission delay time in crossed wires between layers.

Conventional wiring methods for semiconductor integrated circuits considering the signal transmission delay time concern semiconductor integrated circuits, as disclosed in JP-A-64-42146, which have a buffer gate inserted between gates to shorten the wiring length between gates for an improved processing speed while preventing the rounding of the signal waveform.

The conventional wiring methods, which are intended to consider an increased signal transmission delay time due to a lengthened wiring length, fail to consider the delay time caused between the object wire, such as a clock signal wire and other wires crossing it. Such conventional wiring methods also pose problem such as variations caused in delay time according to the number of crossed wires even for a small delay time.

The conventional wiring methods, therefore, cannot be applied successfully to semiconductor integrated circuits using clock signal wires requiring an appropriate timing.

SUMMARY OF THE INVENTION

The object of the present invention is to provide a wiring method for semiconductor integrated circuits which minimizes the variations in signal transmission delay time, while at the same time being capable of shortening the total delay time.

The above and other objects, features and advantages will be made apparent by the detailed description taken in conjunction with the accompanying drawings.

A representative feature of the invention disclosed in the present application will be briefly described below.

According to one aspect of the present invention, there is provided a wiring method for semiconductor integrated circuits of multilayered structure used for wiring layers with limited maximum and minimum values and variations in the signal transmission delay time, and primarily comprising general wiring layers, excluding a power layer, which include a bottom layer, an uppermost layer or a combination of the bottom and uppermost layers.

At the time of selecting a wiring having a limited signal transmission delay time, a weight is added by signal type for allottment to the wiring layer in the descendant order of weight.

According to another aspect of the present invention, there is provided a wiring method for semiconductor integrated circuits of multilayered structure in which the signal transmission delay time is fixed by equalizing the wiring lengths. The number of wires crossing each of the wires of equal length is equalized or adjusted within a predetermined range by changing the wiring route of other wires or by generating an antenna pattern.

According to still another aspect of the present invention, there is provided a wiring method for semiconductor integrated circuits of multilayer structure, in which the signal transmission delay time is equalized, and the number of wires crossing each of the wires having an equal signal transmission delay time is equalized or adjusted within a predetermined range by changing the wiring route of other wires or by generating an antenna pattern.

At the time of selecting a wire for adjusting the number of crossed wires, it is assured to make adjustment only on the wires deviating from a predetermined tolerable range of variations in signal transmission delay time.

In the above-mentioned wiring methods for semiconductor integrated circuits, layers of wires limited in signal transmission delay time comprise general wiring layers including the uppermost layer or the bottom layer, or a combination of the bottom and uppermost layers, with the allotment to the wiring layers in the descendant order of weight by signal type (application). The delay time caused by crossed wires occurs only with the bottom or uppermost layer, thereby reducing the occurrence of delay time in the presence of an intemediate layer to one half.

The occurrence of crossed wires is thus reduced by one half in spite of variations in delay time of each signal unit according to the number of crossed wires. Therefore the variation in delay time is also halved, thereby reducing the delay time at the same time.

Also, according to another wiring method for semiconductor integrated circuits described above, the number of wires crossing each of the wires equal in length for fixing the signal transmission delay time is equalized or adjusted within a predetermined range by changing the wiring route of other wires or by generating an antenna pattern only for the wires deviating from a predetermined tolerable range of variations in signal transmission delay time. It is thus possible to equalize the number of wires crossing such wires as requiring the consideration of delay time.

As a result, the variations in delay time caused by the capacity of crossed wires can be minimized.

Further, in still another wiring method for semiconductor integrated circuits according to the present invention, the number of wires crossing each of the wires equal in signal transmission delay time is equalized or adjusted within a predetermined range by changing the wiring route of other wires or by generating an antenna pattern, thereby making it possible to equalize the number of wires crossing the wires requiring the consideration of delay time.

Consequently, the variations in delay time caused by the capacitance of crossed wires are minimized. Also, since the length of wirings limited in delay time is not necessarily equalized, the freedom and versatility of wirings are improved.

The effects of representative features of the present invention disclosed by the present application will be further explained below.

(1) Wiring layers primarily including wires limited in variations and maximum and minimum values of signal transmission delay time comprise general wirings of a bottom layer, an uppermost layer or a combination of the bottom and uppermost layers excluding a power layer. At the time of selection of wires limited in signal transmission delay time, allotment is made to the wiring layers in the descendant order of the weight added in accordance with signal type, the delay time under the effect of crossed wires occurs only in crossed wires of the bottom or uppermost layer, so that the occurrence of delay time with an intermediate layer is reduced by one half, thereby reducing the variation in delay time by one half.

(2) The number of wires crossing each of the wires equal in length is equalized or adjusted within a predetermined range by changing the wiring route of other wires or by generating an antenna pattern only for the wires deviating from a predetermined tolerable range of variations in signal transmission delay time. Thus, the number of wires crossing a given wire requiring consideration of delay time is equalized, thereby making it possible to minimize the variations in delay time caused by the capacitance of crossed wires.

(3) The number of wires crossing each of the wires having an equal signal transmission delay time is equalized or adjusted within a predetermined range by changing the wiring route of other wires or by generating an antenna pattern, whereby the number of wires crossing a given wire requiring consideration of delay time is equalized. Thus, as in (2) above, the variations in delay time caused by the capacitance of crossed wires is minimized, while at the same time eliminating the necessity of equalizing the length of wirings limited in delay time as compared with (2), thereby improving the wiring freedom and versatility.

(4) The advantages described in (1), (2) and (3) make it possible to minimize the variations in signal transmission delay time and reduce the delay time at the same time, thereby making it possible to provide a wiring method successfully applicable to semiconductor integrated circuits such as clock signal wirings requiring an appropriate timing.

DESCRIPTION OF THE PREFERRED EMBODIMENTS

Figure 1:
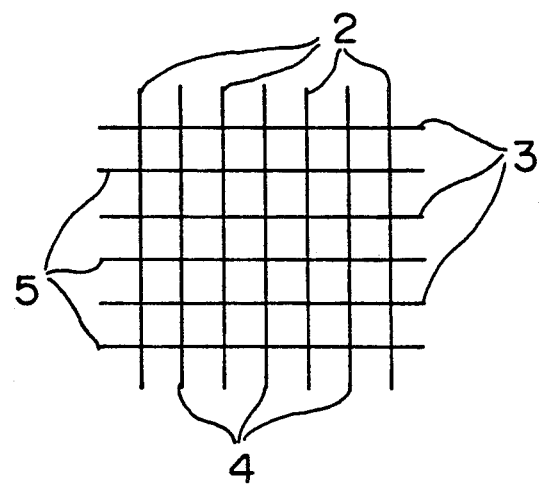
FIG. 1 is a schematic front view of a semiconductor integrated circuit showing a wiring method for semiconductor integrated circuits according to a first embodiment of the present invention.
Figure 2:
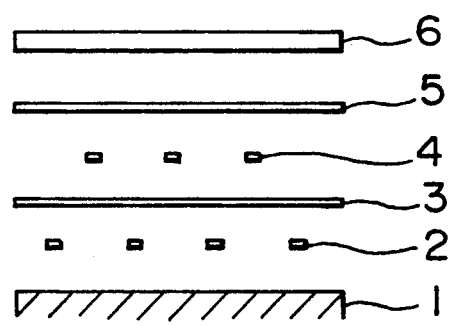
FIG. 2 is a sectional view schematically showing a semiconductor integrated circuit according to the first embodiment.

First, a configuration of a semiconductor integrated circuit according to a first embodiment will be described with reference to FIGS. 1 and 2.

The semiconductor integrated circuit according to the present embodiment is configured of, say, six wiring layers in a structure comprising a first layer 1 formed with gates, a second layer 2 making up a logic wiring layer, a third layer 3, a fourth layer 4, a fifth layer 5 and a sixth layer 6 making up a power layer. The second layer 2 and the fourth layer 4 are formed with lattice-shaped wirings in longitudinal direction, and the third layer 3 and the fifth layer 5 with lattice-shaped wirings in lateral direction The sixth layer 6 making up the power layer forms a broad pattern.

Now, the operation of this embodiment will be described.

Figure 3:
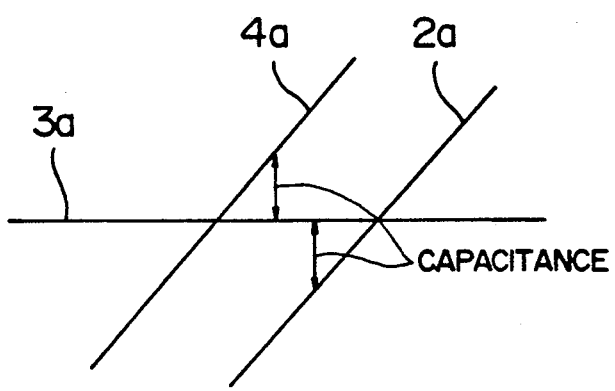
FIG. 3 is a diagram for explaining the occurrence of capacitance by crossed wires in a semiconductor integrated circuit according to the first embodiment.

In a semiconductor integrated circuit having a multi-layered wiring structure as described above, assume that a signal transmission delay time affecting an increased processing speed is computed As one of the factors for such a computation, it is necessary to consider the capacitance generated between the intended wire and wires crossing it. For example, take note of the wire 3a of the third layer 3 as shown in FIG. 3. It is necessary to take into consideration the capacitance due to the crossing of the wire 2a of the second layer 2 and that due to the crossing of the wire 4a of the fourth layer 4.

Also, in the case of a clock signal wiring pattern, the wiring length is consciously designed to be equal in order to equalize the delay time due to the wiring length. In actual wirings, however, there are wires crossing such clock signal wires as shown in FIGS. 4 and 5, and the resulting delay time causes variations in delay time according to the number of crossed wires for each clock signal wiring.

Figure 4:
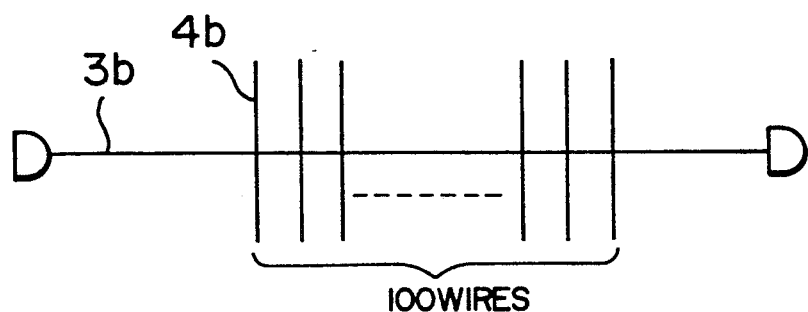
FIG. 4 is a diagram for explaining the difference in signal transmission delay time due to crossed wires according to the first embodiment.
Figure 5:
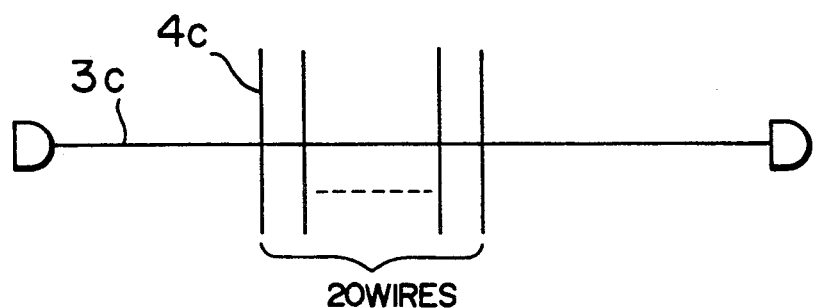
FIG. 5 is a diagram for explaining the difference in signal transmission delay time due to crossed wires according to the first embodiment.

When the wire 3b crosses 100 wires 4b as shown in FIG. 4 or the wire 3c crosses 20 wires as shown in FIG. 5, for instance, there develops a difference in delay time due to the capacitance of the crossings of 80-equivalent wires. Preventive means would be to eliminate crossed wires or equalize the number of crossed wires. The former method, however, leads to unavoidable setting of a crossing-prohibited area in the second layer 2 and the fourth layer 4, resulting in a reduced wiring area of the second layer 2 and the fourth layer 4. This could represent a great cause of wiring failure.

According to this embodiment, in order to minimize and equalize the crossed wires without affecting other wires, the wires such as clock signal wires requiring consideration of delay time are laid using the second layer 2 making up the bottom layer of general wirings, the fifth layer 5 making up the uppermost layer, or a combination the second layer 2 and the fifth layer 5 as main wiring layers.

Figure 6:
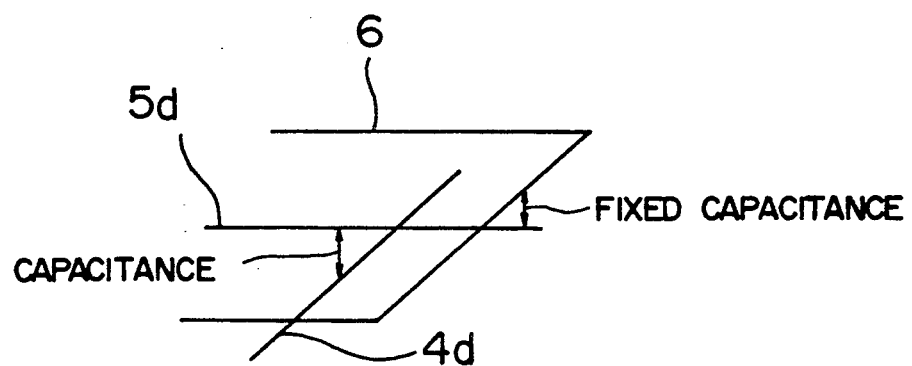
FIG. 6 is a diagram for explaining causes of occurrence of capacitance due to crossed wires according to the first embodiment.
Figure 7:
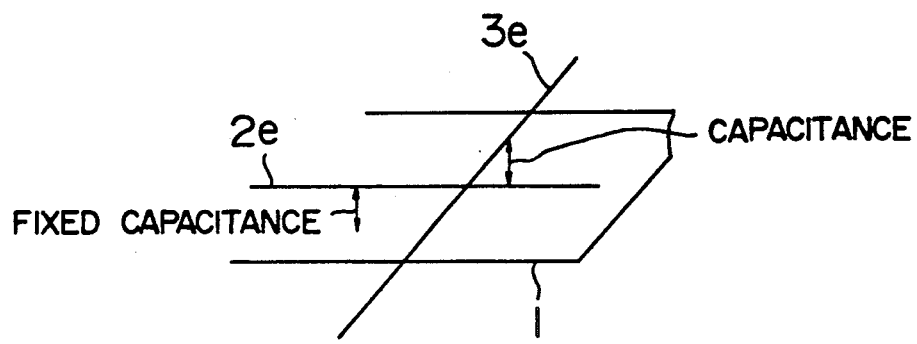
FIG. 7 is a diagram for explaining causes of occurrence of capacitance due to crossed wires according to the first embodiment.

More specifically, when the fifth wiring layer 5 is used, for instance, only the wire 4d of the fourth layer 4 crosses the wire 5d of the fifth layer 5 as shown in FIG. 6, and the sixth layer 6, which is a wide solid pattern, requires no consideration as a factor of variation in delay time. The wire 2e of the second layer 2, on the other hand, crosses only the wire 3e of the third layer 3 as shown in FIG. 7, and therefore need not be taken into consideration as the sixth layer 6 since the first layer 1 is covered with gates. In this way, the use of the second layer 2 or the fifth layer 5 as a main wiring layer reduces the variation factor of delay time by one half as compared with that of the third layer 3 or the fourth layer 4.

Figure 8:
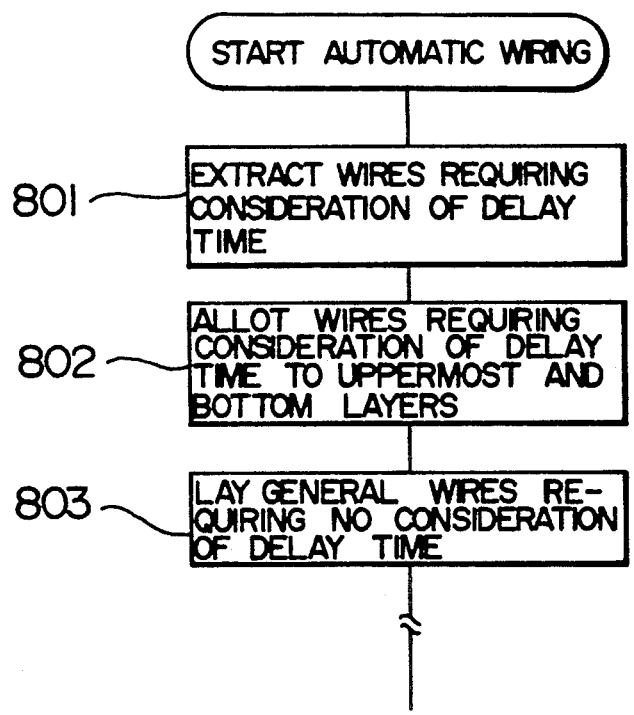
FIG. 8 is a flowchart showing the processes of an automatic wiring program according to the first embodiment.

In actual automatic wiring operation, wires requiring consideration of delay time such as clock signal wires are extracted as shown in FIG. 8 (step 801). This extraction is made specifically by identifying a part the signal name with a key or mating parameter and tracing by a clock pin such as an FF circuit. Preferential allotment is made using the fifth layer 5 and the second layer 2 as main wiring layers (step 802). After that, general wires are laid (step 803).

In using the fifth layer 5 and the second layer 2, the shortage of wiring channels or the wiring rate exceeding 100% rarely occurs due to the preferential wiring.

The wires requiring consideration of the wiring delay time of semiconductor integrated circuits, however, include wirings requiring an appropriate timing, such as clock signal wirings and scan signal wirings, and are limited in maximum and minimum values for general logic wirings. For this reason, substantially all the wirings are subjected to consideration of delay time, thus making direct application of the invention impossible.

According to the present invention, on the other hand, weight is added to the items limiting the delay time, and wires are laid in the descendant order of weight preferentially up to a predetermined percentage or within an available range thereby to secure a sufficient effect.

As a result, in a semiconductor integrated circuit according to the present embodiment, the second layer 2, the fifth layer 5 or both of them are used as main wiring layers limited in maximum and minimum values and variations in signal transmission delay time. Wirings are made in the descendant order of weight of items limiting the delay time, so that the variations in delay time are reduced as compared in the prior art, thereby making it possible to produce high-speed and high-performance semiconductor integrated circuits.

Figure 9:
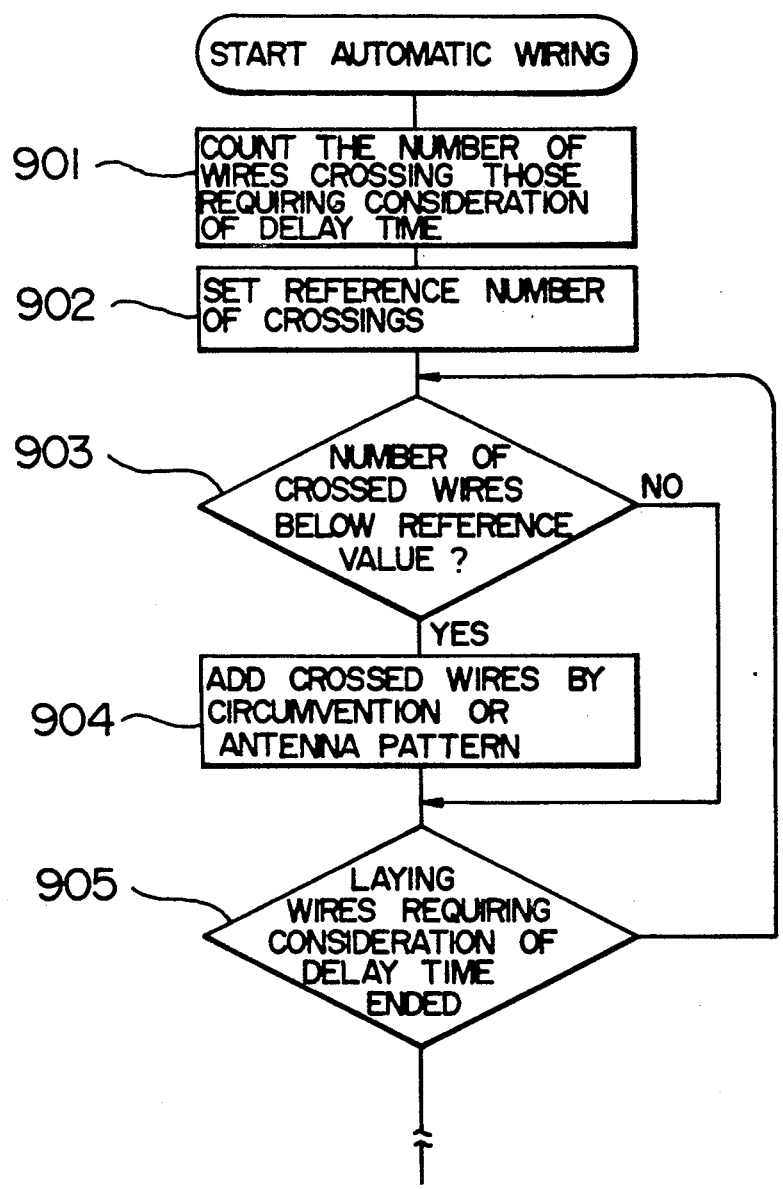
FIG. 9 is a flowchart showing the processes of an automatic wiring program for a semiconductor integrated circuit based on a wiring method according to a second embodiment of the present invention.
Figure 10:
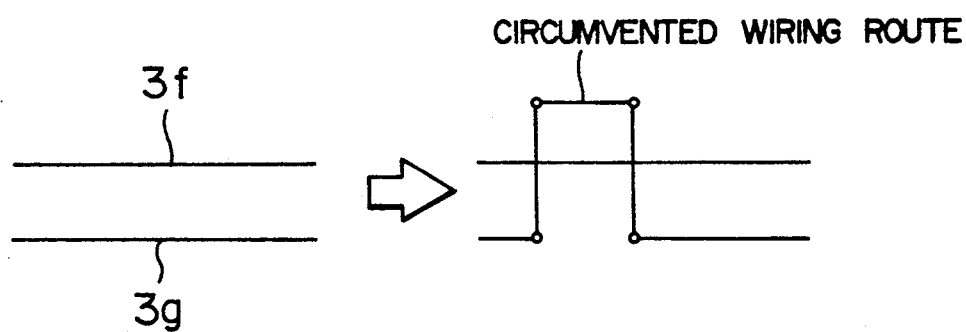
FIG. 10 is a diagram for explaining the adjustment of the capacitance of crossed wires due to the change in wiring route according to the second embodiment.
Figure 11:
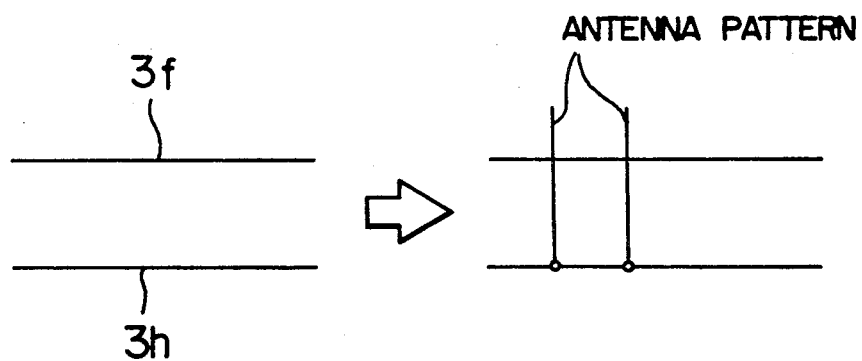
FIG. 11 is a diagram for explaining the adjustment of the capacitance of crossed wires due to the generation of an antenna pattern according to the second embodiment

FIG. 9 is a flowchart showing the processes of an automatic wiring program of a wiring method for semiconductor integrated circuits according to another embodiment of the present invention, FIG. 10 is a diagram for explaining the adjustment of the capacitance of crossed wires by changing the wiring route according to the present embodiment, and FIG. 11 is a diagram for explaining the adjustment of the capacitance of crossed wires by generation of an antenna pattern.

The wiring method for semiconductor integrated circuits according to the present embodiment concerns the adjustment of the number of wires crossing each of wires requiring consideration of limitation of signal transmission delay time within a predetermined range.

First, automatic wiring is conducted as shown in FIG. 9. This automatic wiring process may use an appropriate method, including the wiring method of the present embodiment, according to the type of the semiconductor integrated circuit involved. The number of wires crossing wires requiring consideration of delay time after completion of automatic wiring is counted (step 901). The upper limit of the number of crossings is set as a reference value within the limited value of delay time (step 902), and this reference value is compared with the number of crossed wires counted (step 903).

In the process described above, assume that a given wire is short in reference value. Take note of the wire 3f of the third layer 3 as shown in FIG. 10, for instance. The general wiring route of the wire 3g is circumvented to add a crossed wire, or, as shown in FIG. 11, an antenna pattern is drawn out of the general wire 3h to add a crossed wire, thereby equalizing the number of crossed wires (step 904). Incidentally, the term antenna pattern 11 means a connection pattern as shown in FIG. 11 in which only an end thereof is connected in order to produce an effective crossing.

The above-mentioned operation is performed for all the wires requiring consideration of delay time (step 905).

As a result, variations in delay time can be reduced as compared with those in the prior art as in the first embodiment, thereby making it possible to produce high-speed and high-performance semiconductor integrated circuits.

The invention made by the present inventor was described above specifically with reference to first and second embodiments. The present invention, however, is not limited to these embodiments, but is, of course, modifiable in various forms without departing from the spirit of the invention.

The semiconductor integrated circuit according to the second embodiment, for example, was described with reference to a case in which the number of crossings is set in such a manner that the delay time does not exceed a limited value. The present invention is not limited to such an embodiment, but is applicable with equal effect to a case in which the tolerance of variation distribution is set in advance and adjustment is made as shown in FIGS. 10 and 11 only for the wires accounting for 30% at the upper and lower portions of distribution. In this case, the overall increase in delay time can be further decreased.

Explanation was made also about a semiconductor integrated circuit comprising a six-layered wiring structure formed with a four-layered logic wiring structure. The present invention, however, is applicable advantageously especially to semiconductor integrated circuits comprising a two- or three-layered logic wiring structure or five or more layers of logic wiring structure.

We claim:

1. A wiring method for semiconductor integrated circuits having a multilayered wiring structure, comprising the steps of:
    extracting wires requiring consideration of delay time;
    allotting the wires requiring consideration of delay time to the uppermost and bottom layers of general wiring layers except for a power layer of the multilayered wiring structure; and
    allotting the wires not requiring consideration of delay time to the portions not allotted with the wires of multilayered wiring structure requiring consideration of delay time.

2. A wiring method for semiconductor integrated circuits having a multilayered wiring structure according to claim 1,
    wherein the step of allotting the wires requiring consideration of delay time includes the steps of:
    classifying the wires requiring consideration of delay time according to the magnitude of limitation of the delay time of the signal flowing therein; and
    allotting the classified wires requiring consideration of delay time to the uppermost and bottom layers of general wiring layers except for a power layer of multilayered wiring structure in the order of magnitude of limitation of signal delay time.

3. A wiring method for semiconductor integrated circuits having a multilayered wiring structure, comprising the steps of:
allotting the wires requiring consideration of delay time and the wires not requiring consideration of delay time for semiconductor integrated circuits automatically to the multilayered wiring structure;
counting the number of points where the wires requiring consideration of delay time cross wires;
setting a reference value of the number of points where the wires requiring consideration of delay time cross wires within a limited value of delay time;
comparing the reference value with the number of points where each of the wires requiring consideration of delay time crosses wires; and
increasing the crossing points by circumventing the wiring route and/or adding an antenna open at an end thereof thereby to substantially equalize the number of points to the reference value with regard to the wires requiring consideration of delay time having a smaller number of points of crossing than the reference value.

4. A wiring method for semiconductor integrated circuits having a multilayered wiring structure according to claim 3,
wherein said step of allotment includes the steps of:
extracting the wires requiring consideration of delay time;
allotting the wires requiring consideration of delay time to the uppermost and bottom layers of the general wiring layers except for the power layer of multilayered wiring structure; and
allotting the wires not requiring consideration of delay time to the portions of the multilayered wiring structure not allotted with the wires requiring consideration of delay time.

5. A wiring method for semiconductor integrated circuits of multilayered wiring structure for fixing the signal transmission delay time by equalizing the wire lengths,
wherein the number of wires crossing each of the wires of equal length is subjected to a selected one of equalization and adjustment to the number of wires with a specified range by a selected one of changing the wiring route of other wires and generating an antenna pattern.

6. A wiring method for semiconductor integrated circuits according to claim 5,
wherein only the wires deviating from a tolerable range of variations in signal transmission delay time are adjusted in the number of crossed wires at the time of selecting the wires requiring the adjustment.

7. A wiring method for semiconductor integrated circuits of multilayered wiring structure for equalizing the signal transmission delay time,
wherein the number of wires crossing each of the wires having an equal signal transmission delay time is subjected to a selected one of equalization and adjustment to the number of wires within a specified range by selected one of changing the wiring route of other wires and generating an antenna pattern.

8. A wiring method for semiconductor integrated circuits according to claim 7,
wherein only the wires deviating from a tolerable range of variations in signal transmission delay time are adjusted in the number of crossed wires at the time of selecting the wires requiring the adjustment.

* * * * *